(12) United States Patent
Seymour

(10) Patent No.: US 6,449,167 B1
(45) Date of Patent: Sep. 10, 2002

(54) METHOD AND APPARATUS FOR BUILDING AND TESTING ELECTRONIC CIRCUITS

(75) Inventor: Arthur F. Seymour, 1245 Rosewood, Deerfield, IL (US) 60015

(73) Assignee: Arthur F. Seymour, Deerfield, IL (US)

( * ) Notice: Subject to any disclaimer, the term of this patent is extended or adjusted under 35 U.S.C. 154(b) by 0 days.

(21) Appl. No.: 09/687,904

(22) Filed: Oct. 13, 2000

(51) Int. Cl.[7] .............................. H05K 7/02; H05K 7/08
(52) U.S. Cl. .................. 361/760; 361/739; 361/748; 361/761; 428/900; 428/901; 434/250; 434/260; 434/52.2; 335/205; 335/207
(58) Field of Search ................................. 361/760, 748, 361/761, 739, 763, 174; 428/900, 901; 174/250, 260, 256, 52.1, 52.2, 52.3, 52.4; 434/301; 335/205, 207, 206

(56) References Cited

U.S. PATENT DOCUMENTS

| 4,650,425 A | 3/1987 | McGarry ..................... 434/219 |
| 4,752,756 A * | 6/1988 | Bartel ......................... 335/205 |
| 4,812,125 A | 3/1989 | Strashun ..................... 434/224 |
| 5,339,219 A | 8/1994 | Urich .......................... 361/760 |
| 5,856,636 A | 1/1999 | Sanso ......................... 174/255 |

* cited by examiner

Primary Examiner—David S. Martin
Assistant Examiner—Hung Bui
(74) Attorney, Agent, or Firm—Welsh & Katz, Ltd.; Thomas W. Tolpin

(57) ABSTRACT

A method and system with a magnetically attractive breadboard and associated devices for constructing and testing electronic circuits. The breadboard can comprise a single or multi-layer circuit board with metallic foil conductors that can be connected to magnetically attractive pads. Electrical contacts between the pads and foil conductors can be made by wrapping the foil over an edge of insulating material. The insulating material can comprise a flexible insulation sheet with the desired circuit printed thereon. The electronic components are preferably supported by component holders which contain magnets that are attracted to the breadboard. The component holders facilitate attachment of the components to the foil conductors. A circuit can be built by selecting the desired component holder, plugging he component into the component holder, and then attaching the component holder to the breadboard on the proper foil conductor to complete the circuit.

6 Claims, 3 Drawing Sheets

METHOD AND APPARATUS FOR BUILDING AND TESTING ELECTRONIC CIRCUITS

BACKGROUND OF THE INVENTION

The present invention relates to a method and system with breadboard and associated magnetic holders used to design, build, and test prototype electrical circuits and is especially useful to teach the technology of electronics.

Electrical circuits are typically prototyped using a printed circuit board which is commonly referred to as a breadboard. A typical breadboard contains a plurality of plated through holes that are coupled to conductive pins or shorting clips. Discrete electrical components are soldered and coupled together by wires which are wrapped around corresponding pins or inserted into the holes of the shorting clips. The discrete components may include integrated circuits, individual transistors, resistors, capacitors, diodes, transformers, batteries, light emitting diodes, and they are all connected to create an electrical circuit.

In the case of wire wrapped breadboards connecting together individual components is a time consuming process, typically requiring the user to wire wrap and/or solder each lead of each component. The final layout for this method may have many wires crossing and will not resemble the final layout of a finished printed circuit board used in production. Parts cannot be removed easily to study the effect of such a removal or demonstrate their function.

In the case of breadboards that use shorting clips, each connection wire must be inserted into the proper shorting clip hole as the circuit is being built. The shorting clips are usually very close to each other and the final layout very rarely resembles the layout of the production circuit. After many parts are connected it may be difficult or even impossible to remove devices buried under the wires used to interconnect the parts. Also the circuit on this type of breadboard is very difficult to trace for errors.

It would be desirable to provide a breadboard with associated electronic device holders which would considerably reduce the time needed to construct, test, and modify a prototype circuit. It is even more desirable if the final breadboard layout resembled the production circuit with a multi-layer breadboard having components visible above the conductive paths and similar to the final board layout to be used in production type circuits.

It is, therefore, desirable to provide an improved circuit board and method of constructing the same, which attains the preceding objectives and overcomes most, if not all, of the preceding problems.

BRIEF SUMMARY OF THE INVENTION

An improved method and apparatus for building and testing electronic circuits is provided which is user-friendly, easy to install and assemble, and fun. Advantageously, the reliable method and apparatus for building and testing electronic circuits provides a convenient breadboard with associated electronic device holders which can considerably reduce the time needed to construct, test and modify an electronic circuit. Desirably, the final breadboard layout can resemble a production circuit with a single or multi-layer breadboard having components visible above the conductive paths so as to appear similar to the final board layout to be used in production type circuits. The attractive and convenient method and apparatus for building and testing electronic circuits can be in the form of a kit and is especially useful to teach the technology of electronics.

One method of constructing a magnetically attractive circuit board can comprise: positioning conductive paths on an insulating material by attaching conductive metallic foil on one side of the insulating material, and placing the other side of the insulated material over a magnetically attractive material. The circuit board can comprise multiple layers in which the conductive metallic foil is crossed and insulting portions comprising insulating tape are placed between the conductive metallic foil at a location where the foil is crossed to separate and insulate the crossed foil. The conductive metallic foil can also be partially or fully wrapped around the insulating material in order to make contact with pads, preferably magnetically attractive pads, to make connection to off board modules. In the preferred method, the desired circuit is printed on the insulating material.

The improved circuit board can comprise: electrical components with leads providing contacts, conductors for connecting the electrical components, and magnets to secure the contacts of the electrical components to the conductors. The improved circuit board can have a breadboard comprising a magnetically attractive material. Desirably, the circuit board assembly can also include magnet-containing holders to hold the electronic components, as well as contain the magnets. Preferably, the magnets are of sufficient magnetic strength to securely engage the magnetically attractive material of the breadboard. The conductors preferably comprise conductive metallic foil, which can be bent around or wrapped over an edge of the insulating material. In the preferred form, a case is provided to house the electronic components. Various modules can be mounted to the case, such as: power sources, signal generators, test equipment, speakers, switches, logic level indicators, modems, cables, amplifiers, transistors, regulators, filters, oscillators, converters, rectifiers, drivers, detectors, modulators, timers, phase lock loops, integrators, differentiators, sample and hold circuits, integrated circuits, and/or batteries.

In the preferred form, an apparatus is provided to build or test an electronic circuit. The portable lightweight apparatus can include a circuit board, an electronic circuit, and an insulating support. The circuit board can provide a breadboard which can comprise a substantially solid and imperforate solid electrically conductive support with a magnetically engageable surface. The electrically conductive support preferably comprises a magnetically attractive material to engage and be attracted to one or more natural magnets. The magnetically attractive material can comprise a sheet of metal fabricated of steel or iron.

The electronic circuit desirably comprises one or more electronic devices connected to electrical conductors. The electronic devices can comprise one or more electronic components with leads that provide electrical contacts to engage the conductors. The conductors preferably comprise electrically conductive metallic foil which is positioned between the electronic devices and the breadboard. If desired, the metallic foil conductors can cross over each other and be separated from each other at an intersection by insulating tape. The electronic components can comprise one or more resistors, capacitors, diodes, light-emitting diodes, transistors, inductors, integrated circuits, batteries, switches, lamps, lights, transformers, speakers, amplifiers, logic level indicators, regulators, signal filters, oscillators, converters, rectifiers, modulators, drivers, detectors, integrators, differentiators, timers, microprocessors, central processing units, computers, calculators, testers, phase lock loops, audible signaling devices, and/or visual signaling devices.

The insulating support can comprise an electrical insulating non-magnetic material, which is positioned between a substantial amount of the conductors and the breadboard. The insulating support can have a conductor-engaging support surface to engage and support a substantial amount of the conductors, and can have a breadboard-facing surface to engage the magnetically engageable surface of the electrically conductive support of the breadboard. The insulating support can comprise a flexible sheet of insulating material comprising paper, paperboard, plastic, tape, or rubber. In the preferred form, the conductor-engaging support surface of the insulating support has a diagram of the electronic circuit printed thereon. The electrically conductive metallic foil can be secured to the conductor-engaging support surface of the insulating support by one or more connectors, such as by adhesive tape, transparent tape, electrical tape, velcro-type fasteners, glue, or adhesive.

The user-friendly apparatus also includes one or more natural magnets to magnetically engage the magnetically engageable surface of the electrically conductive support of the breadboard to secure the insulating support to the magnetically engageable surface of the breadboard, as well as to securely connect the electrical contacts to the electrically conductive metallic foil conductors. Advantageously, one or more holders are provided to hold the magnets and support the electronic devices to removably and detachably connect the electronic devices to the electrically conductive metallic foil conductors of the electronic circuit.

The breadboard can comprise a single or multiple layer (multi-layer) circuit board with metallic foil conductors that can be connected to magnetically attractive pads. As discussed previously, electrical contacts between the pads and the metallic foil conductors can be made by bending or wrapping the foil over an edge of the sheet oft insulating material. The electronic components are preferably supported by component holders which contain magnets that are attracted to the breadboard. The component holders facilitate attachment of the electronic components to the metallic foil conductors.

Desirably, a prototype circuit can be built by selecting the desired component holder, plugging the electronic component into the component holder, and then attaching the component holder to the breadboard on the proper foil conductor to complete the electronic circuit. The metallic foil conductors can also be magnetically pressed against the magnetically attractive pads to make connection to off board power and signal sources or outputs.

A prototype circuit can be built with the present invention, such as by first designing the board layout. Electronic components can be placed on the printed circuit board. The interconnecting circuit paths can then be sketched or printed onto the surface of the insulating material that will be used as the circuit board. Metallic foil, such as comprising a metal foil tape with glue on one side, can be placed over the printed or sketched or printed paths. A plastic insulating tape can be placed between overlapping metal foil tapes to prevent shorts. The metal foil tape can be folded over the edge of the insulating material to make contact to pads under the edges of the breadboard. The insulating material with metal foil tape attached thereto can then be placed on a magnetically attractive surface with the metal foil tape under the board aligned to corresponding input, output, or power pads.

After the breadboard is fabricated and placed into a case, the electronic components to be interconnected can be placed into their corresponding magnet-containing holders. These holders can then placed on the metallic foil in the proper locations to complete the desired circuit. Desirably, the magnets are pulled toward the magnetically attractive surface under the insulating material to force the leads of each component into the(conductive foil paths with enough force to complete the circuit contacts. A circuit constructed in this manner greatly reduces the time required to build a prototype circuit and allows for easy movement and removal of parts.

The pads that make contact to the metallic foil folded over the edge of the breadboard can be used to provide power and other signals to the breadboard as well as to connect cables and speakers for output from the breadboard.

The present invention can provide a system with means for constructing a breadboard that uses associated magnetic holders and a special case for external connections to fabricate an electronic circuit which is quickly built and easy to test and modify.

Advantageously, the inventive method and apparatus for building and testing electronic circuits provided unexpected, surprisingly good results.

A more detailed explanation of the invention is provided in the following description and appended claims taken in conjunction with the accompanying drawings.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
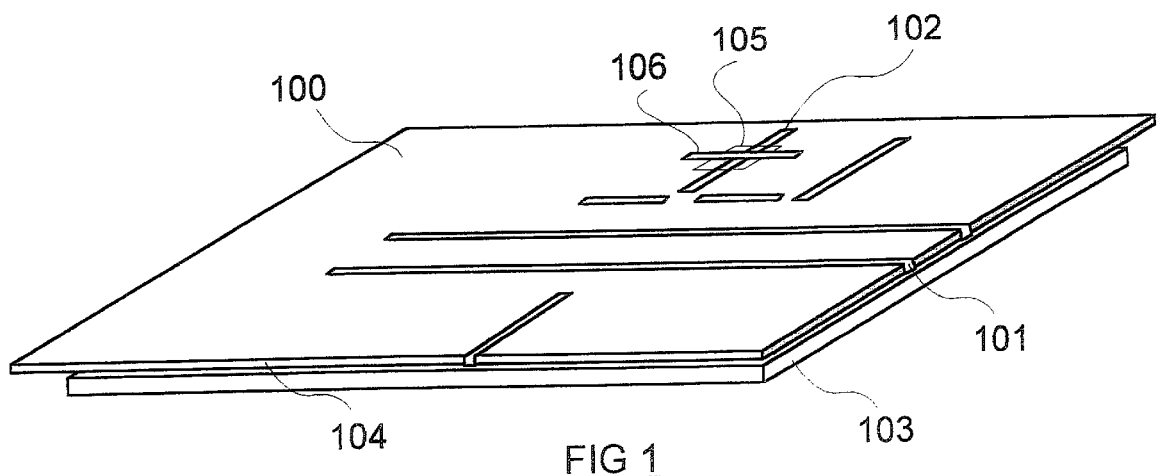
FIG. 1 is a perspective view of a magnetically attractive breadboard used in this invention.

Referring to the drawings more particularly by reference numbers, FIG. 1 is a perspective drawing showing the construction of the breadboard 100 comprising a printed circuit board used to interconnect parts in this invention. A flexible sheet of insulating material 104 comprising paper, paperboard, plastic or rubber, is used as a base upon which conductors comprising conductive paths 101, 102, 106 are placed. The conductive paths can comprise flexible electrically conductive metallic foil, such as aluminum foil, copper foil, or tin foil, to provide flexible foil conductive paths. The metallic foil can comprise metal foil tape with adhesive or glue on its underside, for attachment to the insulating material. Conductive path 101 wraps around the edge of the sheet of insulating material 104 in order to make contact on the underside. Conductive path 106 crosses over conductive path 102 and is insulated by plastic insulating tape 105 to prevent shorting. In this manner a multiplicity of conductive paths and layers can be placed on the insulating material 104 forming a breadboard for electronic components. This breadboard is then placed over a sheet of metallic magnetically attractive material 103.

Figure 2:
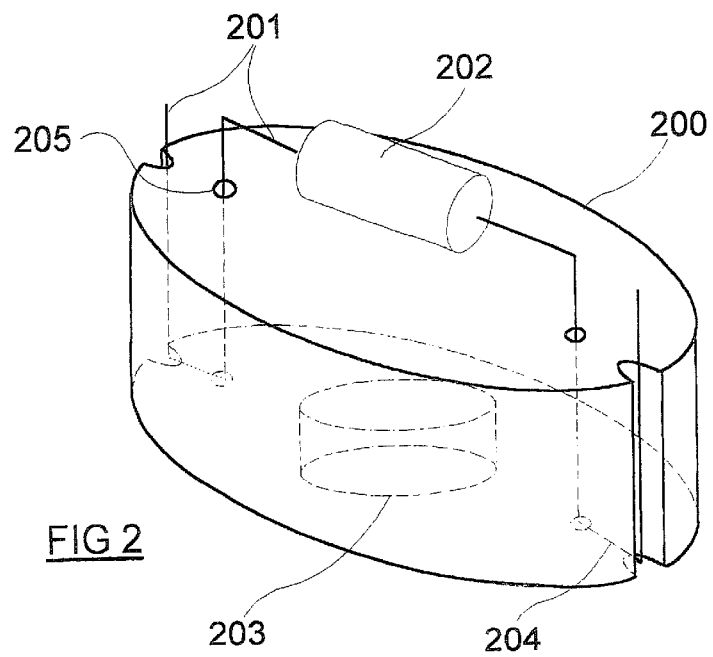
FIG. 2 is a perspective view of a magnetic holder used to attach resistors, capacitors, diodes, and other electronic parts with two leads to the magnetically attractive breadboard.

FIG. 2 is a perspective drawing showing how a two (2) leaded electronic device 202 comprising electronic components, such as a resistor, is fastened to a magnet-containing holder 200, sometimes referred to as a "magnet-holder", "magnetic holder", or "component-holder". The magnet-containing holder contains, holds, covers, supports and/or houses a natural magnet 203. The magnet-containing holder can be molded or fabricated or impact-resistant plastic or other non-magnetic material. The magnet-containing holder can also hold and support the electronic device 202 comprising an electrical component such as a resistor. The leads 201 of the electronic device, e.g. resistor, can be passed through holes 205 in the magnetic-containing holder 200 and run across the bottom 204 of the magnet-containing holder and then back up the side of the magnetic-containing holder 200. Inside each magnet-containing holder 200 is one or more magnets 203 that will pull the leads 204 into the conductive paths 101, 102, 106 on the breadboard 100. The magnet 203 preferably is of sufficient magnetic strength to pull the leads 204 into the conductive path 101, 102, 106 and make a good electronic contact. Magnet-containing holder 200 can hold any two leaded electronic device 202 with two wire type leads 201 attached including, but not limited to, resistors, diodes, and capacitors.

Figure 3:
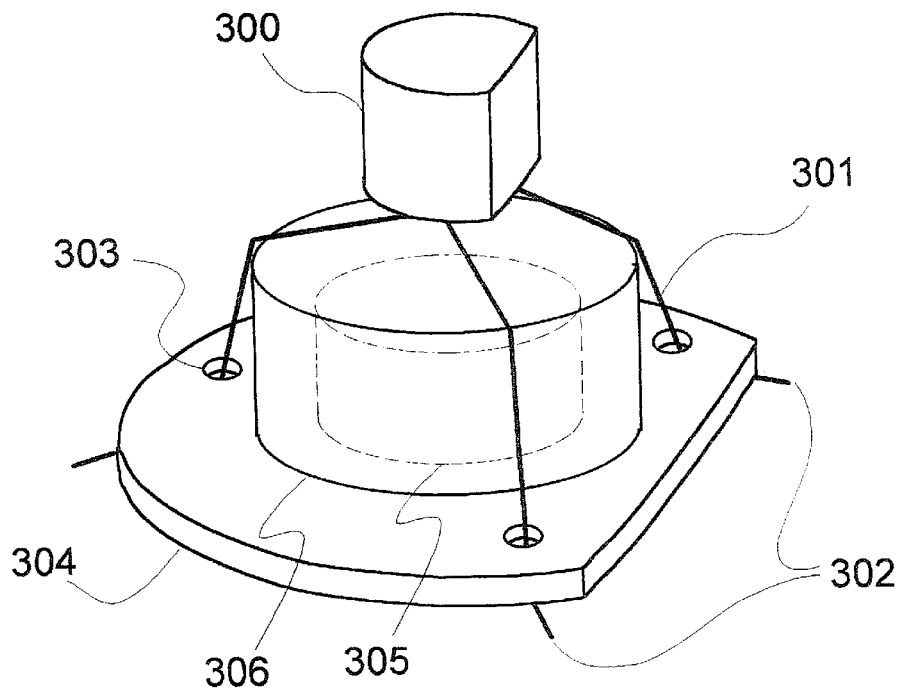
FIG. 3 is a perspective view of a magnetic holder used to attach transistors and other electronic parts with three leads to the magnetically attractive breadboard.

FIG. 3 is a perspective drawing showing how a three (3) leaded electronic device 300, comprising an electronic component, such as a transistor, is fastened to a magnetic-containing holder 304, also sometimes referred to as "magnet-holder", "magnetic holder", or "component-holder". The leads 301 of the electronic device, e.g. transistor, are passed through holes 303 in the magnetic-containing holder 304 and extend outward to form contact leads 302. A portion of the magnet-containing holder 304 comprises a magnet housing 306 that holds, contains, covers, supports and/or houses one or more natural magnets 305. The magnet-containing holder can be molded or fabricated of impact-resistant plastic or other non-magnetic material. The magnet-containing holder can also hold and support the electronic device comprising an electronic component, e.g. transistor. When the magnet-containing holder 304 is placed on a magnetically attractive breadboard 100, the magnet 305 will pull the leads 302 into the conductive paths 101, 102, 106 on the breadboard 100. The magnet 305 is preferably of sufficient magnetic strength to pull the leads 302 into the conductive path 101, 102, 106 and make a good electronic contact. Magnet-containing holder 304 can hold any three (3) leaded electronic device 300 with three (3) wire type leads 302 attached including, but not limited to, transistors, dual color light emitting diodes (LEDs), and silicon controlled rectifiers.

Figure 4:
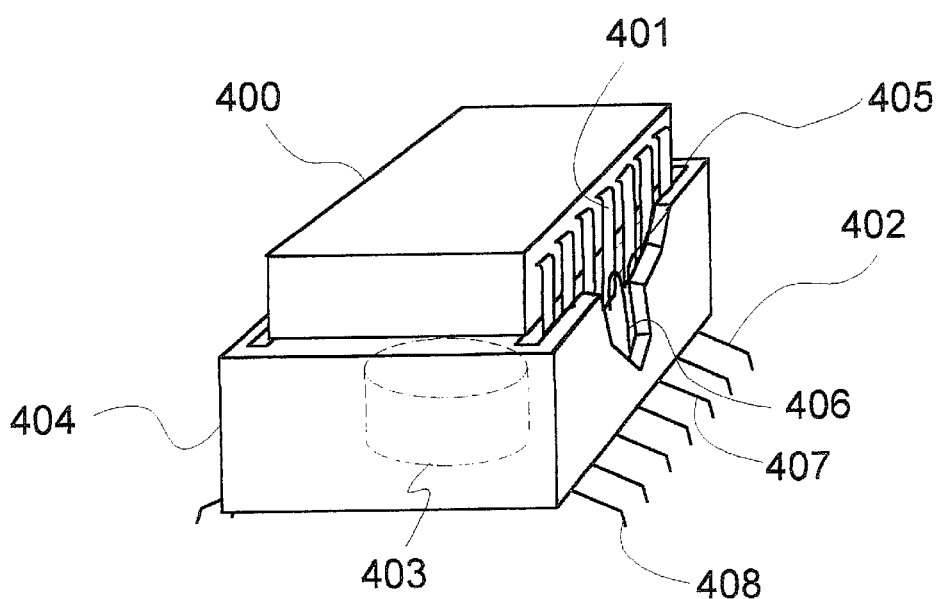
FIG. 4 is a perspective view of a magnetic holder used to attach integrated circuits and other electronic parts with many leads to the magnetically attractive breadboard.

FIG. 4 is a perspective drawing with a section removed to show how an electronic component(s) comprising an integrated circuit 400 is securely fastened and attached to a magnet-containing holder 404, which is also sometimes referred to as a "magnetic-holder", "magnet-holder", "component-holder" or "integrated circuit holder". The magnet-containing holder can be molded or fabricated of impact-resistant plastic or other non-magnetic material. The magnet-containing holder can also hold and support the electronic device comprising an electrical component(s), e.g. the integrated circuit 400. The integrated circuit leads 401 can pass through holes 405 in the magnetic-containing holder 404 and make contact to wire leads 406. The magnet-containing holder can be molded or fabricated of impact-resistant plastic or other non-magnetic material. The magnet-containing holder can also hold and support the electronic device comprising an electrical component, e.g. the integrated circuit 400. The wire leads 406 can pass through the body of the magnet-containing holder 404 and each lead can extend outward away from body of magnetic-containing holder 404. The outwardly extending wire leads 407, 406, 408 can be made of flexible conductive wire. The tip of each wire lead 408 can be bent to produce a point contact when pressed against conductive paths 101, 102, or 106. portion of the integrated circuit magnet-holder 404 holds, contains, covers, supports and/or houses a natural magnet 403. When the magnet-containing holder 404 is placed on a magnetically attractive breadboard 100, the magnet 403 will pull the leads 407 and their respective tips 408 into the conductive paths 101, 102, 106 on the breadboard 100. The magnet 403 should be of sufficient magnetic strength to pull the lead tips 408 into the conductive paths 101, 102, 106 and make a good electronic contact. The magnet-containing holder 404 can be designed and arranged to hold integrated circuits 400 with any number of leads 401. The magnetic strength can be increased by using more than one magnet 403.

Figure 5:
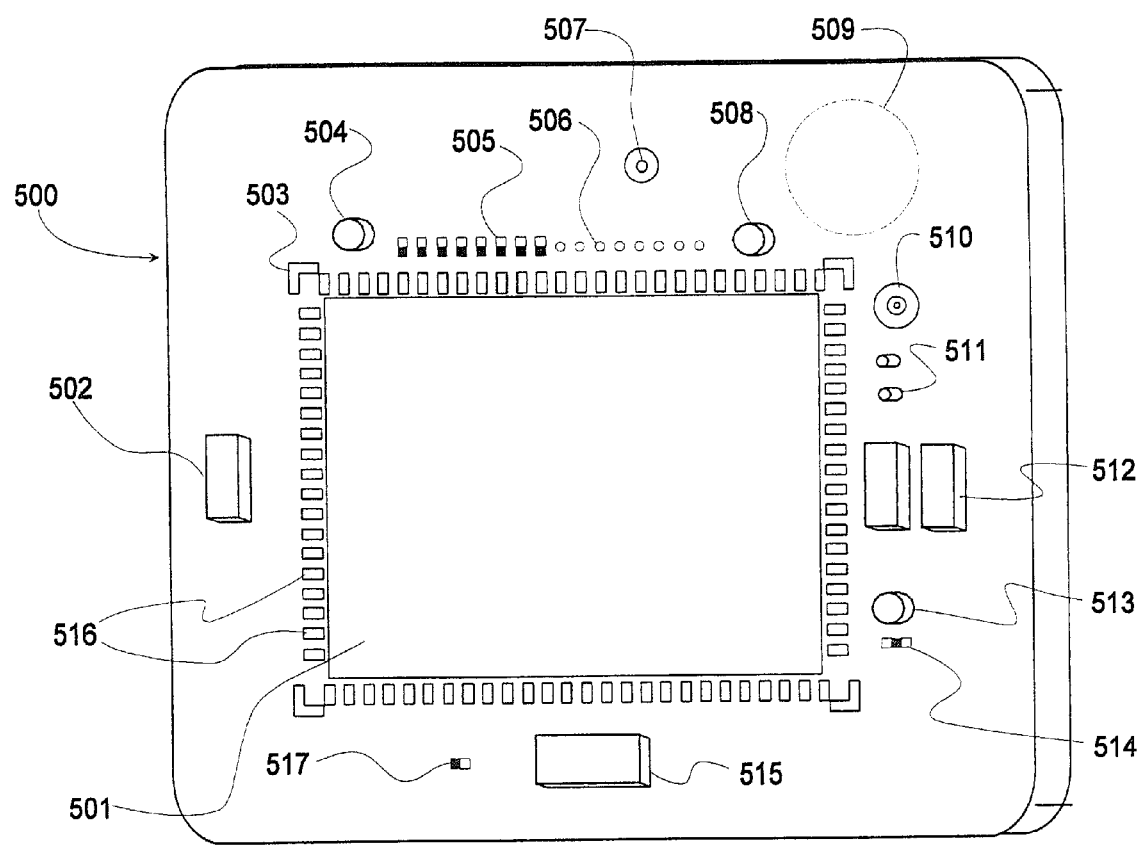
FIG. 5 is an enlarged perspective view of case used to hold and provide inputs and outputs to the magnetically attractive breadboard.

In the preferred embodiment, the breadboard 100 is placed in a case 500 preferably an insulated case comprising impact-resistant plastic, as shown in FIG. 5. The sheet of magnetically attractive material 103 shown in FIG. 1 can be permanently mounted in case 500 to provide a flexible magnet-attracting metal sheet 501, e.g. fabricated of steel or iron. Surrounding the magnet-attracting metal sheet 501 can be an array of contact pads 516 also made of steel, iron, or some other magnetically attractive material. Contact pads 516 make contact to the conductive foil 101 when the breadboard 100 is properly placed over he metal sheet 501. Four (4) comer keys 503 can be used to properly align the breadboard 100 to the metal sheet 501 and contact pads 516. The contact pads are not limited to but can be used to connect the breadboard 100 and breadboard foil conductors 101 to external apparatus. The following is an exemplary list of apparatus that the contact pads 516 can connect to the breadboard 100: an eighteen (18) pin integrated circuit socket 502; a twenty-four (24) pin integrated circuit socket 515; seven segment light emitting diode display 512; various electronic plugs for input or output signals 507, 510, 511; data switches 505; logic level indicators 506; variable resistors 504, 508; one or more speakers 509; a variable frequency generator control 5131 one or more frequency range switches 514; on-off power switch 517; and one or more batteries.

The case 500 can also contain a power source or use an electronic plug 507 to bring power to the proper contact pad 516 for the breadboard 100. Computer data signals can be brought to and from the breadboard 100 through an electronic plug 510. In this manner, many different signals and external electronic apparatus can be connected to a breadboard 100 that uses metallic foil paths 102, 106 to interconnect electronic components that are held by the magnetic-holders 200, 304, 404.

This invention provides a method and system with means for constructing a breadboard that uses associated magnet-containing holders and an optional case for external connections to fabricate an electronic circuit which is quickly built and easy to test and modify. The method and system of the invention can also be used for technology teaching equipment and is user friendly. Furthermore, the method and system of the invention also provide circuits for the placement of electronic components on a prototype or finished printed circuit board for use in manufacturing circuit boards.

Among the many advantages of the inventive method and apparatus for building and testing electronic circuits are:

1. Outstanding performance.
2. Superior aid for teaching the technology of electronics.
3. Superb kits with moveable components for constructing electronic circuits.
4. Excellent educational value.
5. Good apparatus for testing electronic circuits.
6. Easy to assemble and install.
7. Simple to operate.
8. User-friendly.
9. Dependable.
10. Easy-to-use.
11. Convenient.
12. Attractive.
13. Economical.
14. Portable.
15. Inexpensive.
16. Safe.
17. Efficient.
18. Effective.

Although embodiments of the invention have been shown and described, it is to be understood that various modifications, substitutions and rearrangements of parts, components, equipment and method (process) steps, can be made by those skilled in the art without departing from the novel spirit and scope of this invention.

What is claimed is:

1. A circuit board for technology teaching or building and testing electronic circuits, comprising:

electronic components with leads providing contacts;

conductors for connecting said electronic components;

magnets for securing said contacts of said electronic components to said conductors;

a breadboard comprising magnetically attractive material;

magnet-containing holders for holding said electronic components and containing said magnets, said magnet-containing holders selected from the group consisting of plastic and non-magnetic material for electrically and magnetically insulating all of said magnets from said electrical components and conductors; and said magnets being of sufficient magnetic strength to securely engage said magnetically attractive material of said breadboard, all of said magnets being insulated by said magnetic-containing holders from electrically contacting said electrical components and said conductors to avoid forming an electrically conductive path with said conductors connecting said electrical components and said leads providing said contacts of said electrical components.

2. A circuit board as defined in claim 1 including:

a case for housing said electronic components; and a plurality of modules mounted to said case.

3. A circuit board as defined in claim 1 wherein said conductor comprises metallic foil wrapped over an edge of insulating material.

4. A circuit board for technology teaching or building and testing electronic circuits, comprising:

electronic components with leads providing contacts;

conductors for connecting said electronic components;

magnets for securing said contacts of said electronic components to said conductors;

a breadboard comprising magnetically attractive material;

magnet-containing holders for holding said electronic components and containing said magnets;

said magnets being sufficient magnetic strength to securely engage said magnetically attractive material;

a case for housing said electronic components;

a plurality of modules mounted to said case; and said conductor comprising metallic foil wrapped over an edge of insulating material.

5. A circuit board as defined in claim 4, wherein said electronic components being held by said magnet-containing holders are selected from the group consisting of: resistors, capacitors, inductors, transformers, transistors, integrated circuits, light emitting diodes, diodes, lights, and batteries.

6. A circuit board as defined in claim 4 wherein said modules are selected from the group consisting of: power sources, signal generators, test equipment, speakers, switches, logic level indicators, modems, cables, amplifiers, transistors, regulators, filters, oscillators, converters, rectifiers, drivers, detectors, modulators, timers, phase lock loops, integrators, differentiators, sample and hold circuits, integrated circuits, and batteries.

\* \* \* \* \*